United States Patent
Wang (10) Patent No.: US 9,806,103 B2
(45) Date of Patent: Oct. 31, 2017

(54) ARRAY SUBSTRATES, METHODS FOR FABRICATING THE SAME, AND DISPLAY DEVICE CONTAINING THE SAME

(71) Applicant: BOE TECHNOLOGY GROUP CO., LTD, Beijing (CN)

(72) Inventor: Xiaolin Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/031,249

(22) PCT Filed: Sep. 17, 2015

(86) PCT No.: PCT/CN2015/089876
§ 371 (c)(1),
(2) Date: Apr. 21, 2016

(87) PCT Pub. No.: WO2016/155258
PCT Pub. Date: Oct. 6, 2016

(65) Prior Publication Data
US 2017/0104016 A1    Apr. 13, 2017

(30) Foreign Application Priority Data
Mar. 30, 2015  (CN) .......................... 2015 1 0145728

(51) Int. Cl.
*H01L 27/14*  (2006.01)
*H01L 27/12*  (2006.01)
(Continued)

(52) U.S. Cl.
CPC ........ *H01L 27/1244* (2013.01); *G02F 1/1368* (2013.01); *G02F 1/136204* (2013.01);
(Continued)

(58) Field of Classification Search
CPC ......... G02F 1/136204; G02F 1/136286; H01L 27/0288; H01L 27/0292; H01L 27/12559
(Continued)

(56) References Cited

U.S. PATENT DOCUMENTS

2015/0049263 A1   2/2015  Chu et al.
2017/0104016 A1   4/2017  Wang

FOREIGN PATENT DOCUMENTS

CN    101236315 A    8/2008
CN    102244082 A   11/2011
(Continued)

OTHER PUBLICATIONS

The World Intellectual Property Organization (WIPO) International Search Report and Written Opinion for PCT/CN2015/089876 dated Nov. 26, 2015 p. 1-13.
(Continued)

*Primary Examiner* — Tan N Tran
(74) *Attorney, Agent, or Firm* — Anova Law Group, PLLC (57) ABSTRACT

The present disclosure provides a method for fabricating an array substrate. The method includes providing a substrate; forming a first pattern on the substrate including a plurality of signal lines and a plurality of electrostatic discharge (ESD) lines, wherein an ESD line is configured to connect two signal lines; and removing a portion of each ESD line during a process for forming a second pattern over the first pattern to disconnect the two signal lines.

20 Claims, 7 Drawing Sheets

(51) Int. Cl.
*G02F 1/1362* (2006.01)
*G02F 1/1368* (2006.01)
*H01L 27/02* (2006.01)

(52) U.S. Cl.
CPC .... *G02F 1/136286* (2013.01); *H01L 27/0288* (2013.01); *H01L 27/0292* (2013.01); *H01L 27/1259* (2013.01); *G02F 2001/136295* (2013.01)

(58) Field of Classification Search
USPC .......................................... 257/59, 72, 432
See application file for complete search history.

(56) References Cited

FOREIGN PATENT DOCUMENTS

| | | | |
|---|---|---|---|
| CN | 202421683 | * | 9/2012 |
| CN | 202421683 | U | 9/2012 |
| CN | 104900633 | A | 9/2015 |
| KR | 20010076529 | A | 8/2001 |
| KR | 20020055783 | A | 7/2002 |
| KR | 20060018730 | A | 3/2006 |

OTHER PUBLICATIONS

State Intellectual Property Office of the P.R.C (SIPO) Office Action 1 for 2015101457288 dated Mar. 30, 2017 20 Pages.

* cited by examiner

ND DISPLAY DEVICE CONTAINING THE SAME

ARRAY SUBSTRATES, METHODS FOR FABRICATING THE SAME, AND DISPLAY DEVICE CONTAINING THE SAME

CROSS-REFERENCES TO RELATED APPLICATIONS

This application is a national phase entry under 35 U.S.C. §371 of International Application No. PCT/CN2015/089876, filed on Sep. 17, 2015, which claims priority to Chinese Patent Application No. CN201510145728.8, filed on Mar. 30, 2015. The above enumerated patent applications are incorporated by reference herein in their entirety.

FIELD OF THE DISCLOSURE

The present disclosure generally relates to the field of display technologies and, more particularly, relates to array substrates, methods for fabricating the same, and a display device containing the same.

BACKGROUND

In recent years, the thin film transistor liquid crystal display (TFT-LCD) technologies continue to develop and improve. TFT-LCD display panels are widely used in products such as televisions, laptop computers, monitors, cell phones, etc.

In the process of fabricating the TFT-LCD display panels, protecting the components from electrostatic charges is critical. To avoid the components to be adversely affected by electrostatic charges, electro-static discharge (ESD) devices formed by diodes are often used in conventional fabrication process to protect the components.

However, because the diodes for the ESD devices are often formed in the later stage of the array fabrication process, for example, after the etching of indium tin oxide (ITO) layer is completed, no ESD protection is provided in the earlier stage of the array fabrication process.

BRIEF SUMMARY OF THE DISCLOSURE

Directed to at least alleviate one or more problems set forth above and other problems in the art, the present invention provides an array substrate, a method for fabricating the array substrate and a display device including the array substrate. By using the disclosed array substrate and the method, components of TFT-LCD display panels can be protected from electrostatic charges in the earlier stage of the array fabrication process.

One aspect of the present disclosure includes a method for fabricating an array substrate. The method includes providing a substrate; forming a first pattern on the substrate including a plurality of signal lines and a plurality of electrostatic discharge (ESD) lines, wherein an ESD line is configured to connect two signal lines; and removing a portion of each ESD line during a process for forming a second pattern over the first pattern to disconnect the two signal lines.

Optionally, a signal line is at least one of a gate line, a gate connection line, a common electrode line, a common electrode connection line, a data line, and a data connection line; and one end of an ESD line is connected to a first signal line and another end of the ESD line is connected to a second signal line.

Optionally, the first signal line and the second signal line are in a same layer and connected by at least one ESD line in the same layer; or the first signal line and the second signal line are in two different layers and connected by at least one ESD line with portions in the two different layers, wherein the portions in the two different layers are connected through via holes.

Optionally, the ESD lines are in a same layer as the gate lines; and each of two ends of an ESD line is connected to at least one of a gate line, a gate connection line, a common electrode line, and a common electrode connection line.

Optionally, one end of the ESD line is connected to a signal line, and the other end of the ESD line is connected to an adjacent signal line.

Optionally, the first pattern is a pattern of a gate metal layer; and the second pattern is a pattern of a source and drain metal layer.

Optionally, a process for removing a portion of each ESD line includes forming a gate insulating layer on the first pattern on the substrate; forming openings in the gate insulating layer to expose at least a portion of each ESD line; forming the pattern of the source and drain metal layer; and removing the portion of each ESD line exposed by the openings.

Optionally, two adjacent gate lines are connected by an ESD line; and two ESD lines connected to a same gate line are distributed at two ends of the gate line.

Optionally, the gate lines are in a display region; the common electrode lines are in a peripheral region; the common electrode lines extend in a direction perpendicular to a direction the gate lines extend; and when the ESD lines are used to connect the gate lines and the common electrode lines, the two ESD lines connected to two adjacent signal lines are distributed at a same side of the peripheral region.

Optionally, the method further includes forming a first thin film transistors (TFT) and a second TFT formed between a gate line and a common electrode line, wherein a source and a gate of each TFT are connected together; the source of the first TFT is connected to the drain of the second TFT; and gates of the first TFT and the second TFT are portions of ESD lines connected to two adjacent signal lines.

Optionally, the gate of the first TFT is a portion of an ESD line connected to the gate line and the gate of the second TFT is a portion of another ESD line connected to the common electrode.

Optionally, each ESD line includes two connecting portions and a discharging portion configured between the two connecting portions; for each ESD line, a width of the discharging portion is less than a width of a connecting portion; and the width of the discharging portion is less than 1.5 µm.

Optionally, the width of the discharging portion is about 1 µm.

Optionally, a gap between two ends at a removed position of an ESD line is about 1 µm to 8 µm.

Optionally, the gap is about 3 µm to 5 µm.

Optionally, the two ends form two terminals each having at least a sharp tip pointing at each other.

Another aspect of the present disclosure includes an array substrate. The array substrate is fabricated by the disclosed method.

Optionally, a signal line is at least one of a gate line, a gate connection line, a common electrode line, a common electrode connection line, a data line, and a data connection line; and one end of an ESD line is connected to a first signal line and another end of the ESD line is connected to a second signal line.

Optionally, the first signal line and the second signal line are in a same layer and connected by the ESD line in the same layer; or the first signal line and the second signal line are in two different layers and connected by the ESD line with portions in the two different layers, wherein the portions in the two different layers are connected through via holes.

Optionally, the first signal line and the second signal line are adjacent to each other.

Optionally, the first pattern is a pattern of a gate metal layer; and the second pattern is a pattern of a source and drain metal layer.

Optionally, gate lines are in a display region; common electrode lines are in a peripheral region; the common electrode lines extend in a direction perpendicular to a direction the gate lines extend; and when the ESD lines are used to connect the gate lines and the common electrode lines, the two ESD lines connected to two adjacent signal lines are distributed at a same side of the peripheral region.

Optionally, the array substrate further includes a first thin film transistor (TFT) and a second TFT formed between a gate line and a common electrode line, wherein a source and a gate of each TFT are connected together; and the source of the first TFT is connected to the drain of the second TFT.

Optionally, gates of the first TFT and the second TFT are portions of ESD lines connected to two adjacent signal lines, wherein the gate of the first TFT is a portion of an ESD line connected to the gate line and the gate of the second TFT is a portion of another ESD line connected to the common electrode.

Another aspect of the present disclosure includes a display device. The display device includes the disclosed array substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention. Wherever possible, the disclosed embodiments and the features disclosed in the exemplary embodiments may be re-arranged without departing from the scope of the present invention.

An aspect of the present disclosure provides a method for fabricating an array substrate.

Figure 1:
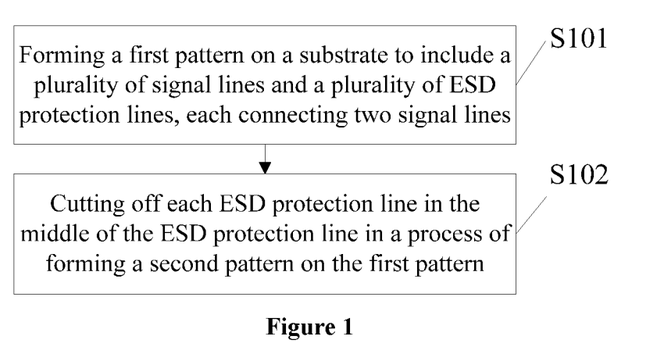
FIG. 1 illustrates an exemplary process for forming an array substrate according to the disclosed embodiments.

FIG. 1 illustrates an exemplary process for fabricating an array substrate. The method includes steps S101 and S102.

In step S101, a first pattern may be formed on a substrate. The first pattern may include a plurality of signal lines and a plurality of ESD lines. Two signal lines may be connected with an ESD line.

In step S102, in a process to form a second pattern on the first pattern, a portion of each of the ESD lines may be removed in the middle of the ESD line.

In one embodiment, an ESD line may be used to connect two signal lines. When an ESD current is generated during the fabrication process of the array substrate, such ESD current may spread in more than one signal lines. The ESD current may also spread in the signal lines and common electrode lines connected by the corresponding ESD line and form equal potentials. Damages to the array substrate caused by the high voltage formed by the ESD may be avoided. Thus, the array substrate can be protected from ESD and production yield of the array substrate can be improved. In the fabrication process of forming the second pattern on the first pattern, a portion of the ESD lines may be removed to ensure the array substrate can be operated normally after being fabricated.

It should be noted that the fabrication process described above should not be limited to pattern the layer formed directly on the layer with the first pattern. The fabrication process may also be used to pattern a layer formed indirectly on the layer with the first pattern, i.e., a layer formed on the layer with the first pattern with one or more layers in between.

The signal lines may include one or more of gate lines, gate connection lines, common electrode lines, common electrode connection lines, data lines, and data connection lines. Both ends of each ESD line may be electrically connected to two signal lines in the plurality of signal lines.

In one embodiment, the signal lines corresponding to the first pattern may be formed in the same layer. For example, the signal lines corresponding to the first pattern may be in the gate metal layer. The signal lines corresponding to the first pattern may also be in the source and drain metal layer. In this case, both ends of each ESD line may be electrically connected to the signal lines in the same layer. In another embodiment, the signal lines corresponding to the first pattern may be in different layers. For example, the signal lines corresponding to the first pattern may include the gate lines in the gate metal layer and the data lines in the source and drain metal layer.

In another embodiment, the signal lines corresponding to the first pattern may include the common electrode lines in the gate metal layer and the data lines in the source and drain metal layer. In this case, the ESD lines may include ESD lines formed in at least two different layers. The two ends of an ESD line may be electrically connected to two signal lines in two different layers. The portions of an ESD line in different layers may be electrically connected through via holes.

When the two ends of an ESD line are connected to the signal lines in the same layer, the ESD line and the corresponding signal lines may be formed in one patterning process. No additional patterning process may be required to form the ESD lines. For illustrative purposes, in an embodiment, the two ends of an ESD lines are connected to the signal lines in the same layer.

Specifically, the ESD lines may be in the same layer as the gate lines and the first pattern may be the pattern of the gate metal layer. Alternatively, the ESD lines may be in the same layer as the data lines and the first pattern may be the pattern of the source and drain metal layer.

It should be noted that, the pattern of the gate metal layer may often include the patterns of gates and gate lines. When the common electrode lines are designed to be in the same layer as the gate lines, the pattern of the gate metal layer may include patterns of the common electrode lines, gates, and gate lines. When gate connection lines and common electrode connection lines are also in the same layer as the gate lines, the pattern of the gate metal layer may further include patterns of the gate connection lines and the common electrode connection lines. The gate connection lines may be used for connecting the gate lines to a gate driving circuit. The common electrode connection lines may be used for inputting or sending electrical signals. The pattern of the source and drain metal layer may often include patterns of data lines, sources, and drains. When the common electrode lines are in the same layer as the data lines, the pattern of the source and drain metal layer may further include pattern of the common electrode lines.

When the ESD lines are in the same layer as the gate lines, the two ends of an ESD line may be electrically connected to two signal lines. The two signal lines may be one or two types of gate lines, gate connection lines, common electrode lines, and common electrode connection lines.

The fabrication process illustrated in FIG. 1 may form array substrate of two different structures.

Figure 2A:
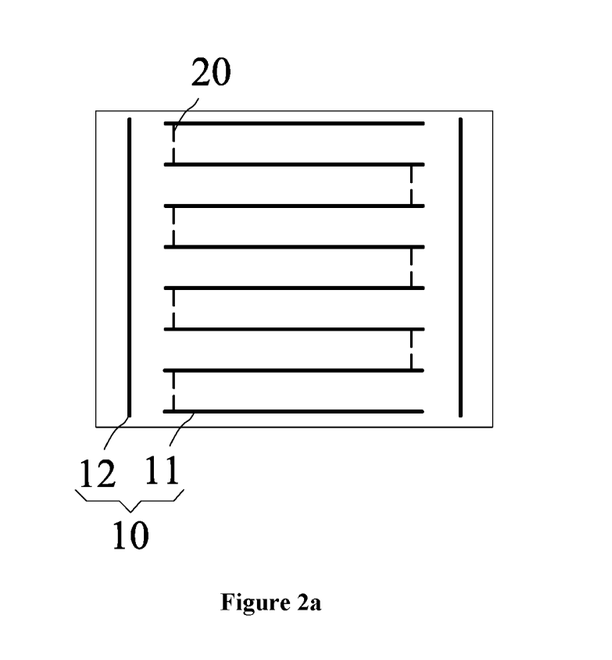
FIG. 2a illustrates a schematic view of an exemplary array substrate according to the disclosed embodiments.
Figure 2B:
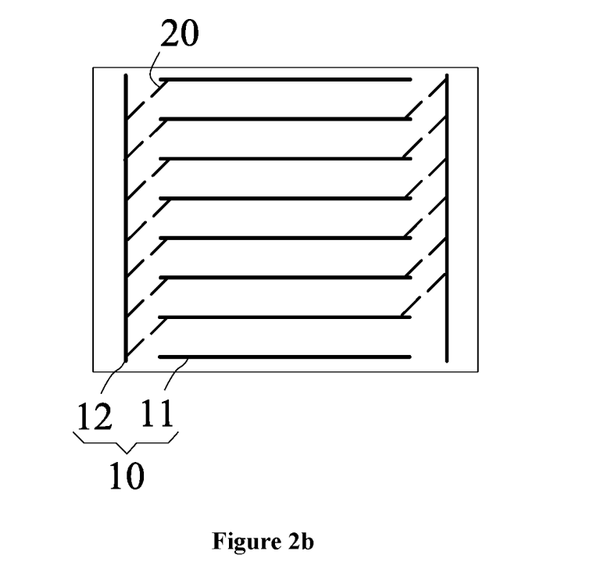
FIG. 2b illustrates a schematic view of another exemplary array substrate according to the disclosed embodiments.

In the first structure, ESD lines are in the same layer as gate lines. The first scenario may be illustrated in FIGS. 2a and 2b. FIGS. 2a and 2b each illustrates the schematic view of an exemplary array substrate. As shown in FIG. 2a, the signal lines 10 may include a plurality of gate lines 11 and a plurality of common electrode lines 12. In the array substrate, the two ends of each ESD line 20 may be electrically connected to two gate lines 11, i.e., each end of the ESD line 20 may be electrically connected to one of the gate lines 11. Alternatively, as shown in FIG. 2b, one end of each ESD line 20 may be electrically connected to one gate line 11 and the other end of the ESD protection lien 20 may be electrically connected to one common electrode line 12, i.e., each ESD line 20 may be formed between a gate line 11 and a common electrode line 12.

It should be noted that, in the array substrate of FIG. 2a, the common electrode lines 12 may be in the same layer as the gate lines 11. Alternatively, the common electrode lines 12 may also not be in the same layer as the gate lines 11. In addition, as described above, when the gate connection lines (not shown) and the common electrode connection lines (not shown) are in the same layer as the gate lines 11, one end of an ESD line 20 may be electrically connected to one gate line 11 and the other end of the ESD line 20 may be electrically connected to one common electrode connection line. Alternatively, one end of an ESD line 20 may be electrically connected to one gate connection line and the other end of the ESD line may be connected to one common electrode line 12. In addition, in the embodiments provided by the present disclosure, the shape of an ESD line 20 may not be limited to the straight lines shown in FIGS. 2a and 2b. For example, an ESD line 20 may also be a curved line, a line with a zigzag shape, or a line with other suitable shapes.

In one embodiment, as shown in FIGS. 2a and 2b, one of the plurality of ESD lines 20 may be used to connect any two adjacent gate lines 11. Alternatively, one of the plurality of ESD lines 20 may be connected to two gate lines 11 separated by other gate lines 11.

Figure 3:
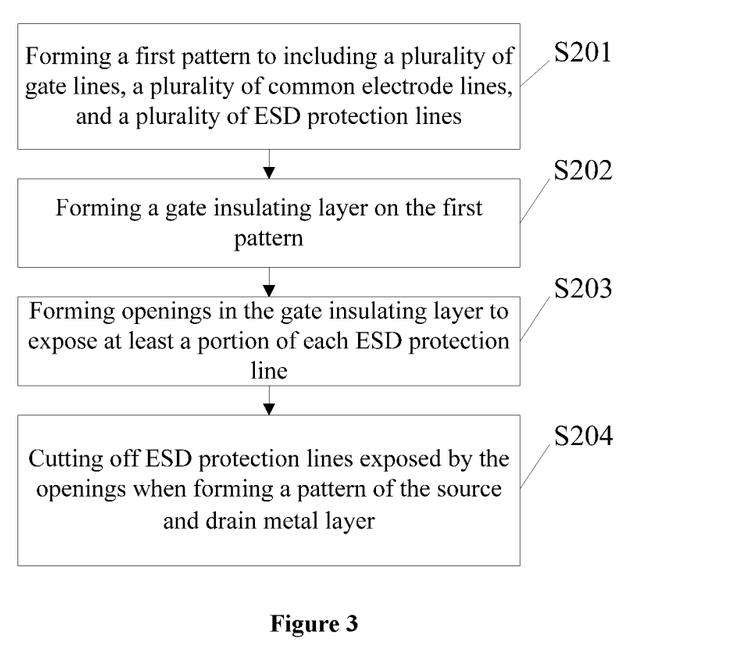
FIG. 3 illustrates an exemplary process for forming another array substrate according to the disclosed embodiments.

FIG. 3 illustrates another process for fabricating the array substrate according to FIGS. 2a and 2b. As shown in FIG. 3, in the fabrication process, the first pattern may be the pattern of the gate metal layer and the second pattern may be the pattern of the source and drain metal layer. A portion of each ESD line 20 may be removed during a source drain (SD) fabrication process, i.e., when the source and drains are being formed. The fabrication process may include the steps S201 to S204.

Figure 4:
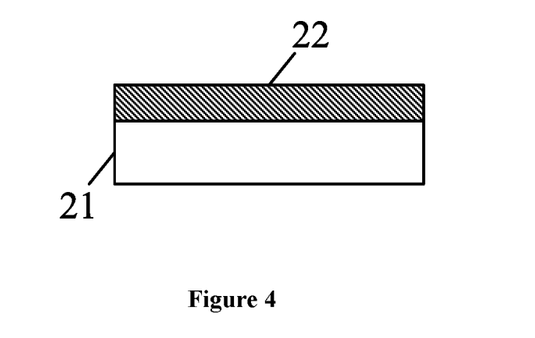
FIGS. 4 to 7 illustrates a schematic view of an array substrate in different stages of an exemplary process for forming the array substrate according to the disclosed embodiments.

In step S201, a first pattern 22 may be formed on a substrate 21. The first pattern may include a plurality of gate lines, a plurality of common electrode lines and a plurality of ESD lines. A cross-section view of the first pattern may be shown in FIG. 4. The two ends of each ESD line may be electrically connected to two signal lines. The two signal lines may be one or two types of gate lines, gate connection lines, common electrode lines, and common electrode connection lines.

Figure 5:
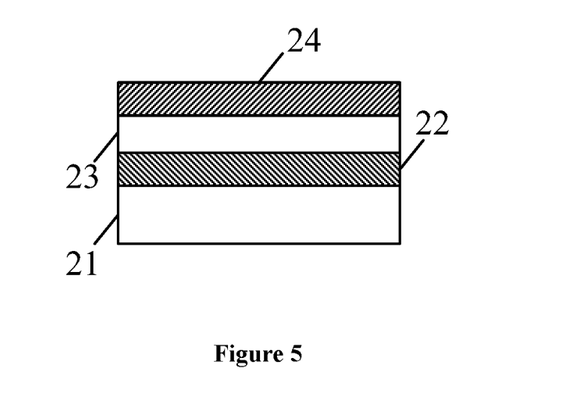

In step S202, as shown in FIG. 5, a gate insulating layer 23 may be formed on the first pattern on the substrate 21.

Figure 6:
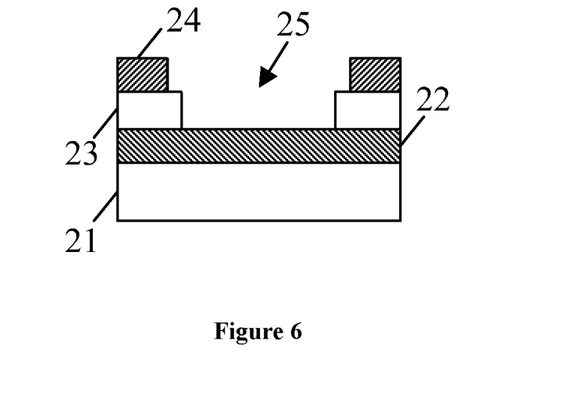

In step S203, as shown in FIG. 6, openings 25 or gate insulating holes (GI holes) may be formed on the gate electrode insulating layer 23 to expose at least a portion of each ESD line.

Specifically, in practice, an etch-stop layer 24 may be formed on the gate insulating layer 23. Photolithography may be used to form the pattern of the openings in the etch-stop layer 23. Further, photolithography and an etching process may be used to etch the openings 25 in the gate insulating layer 23.

Figure 7:
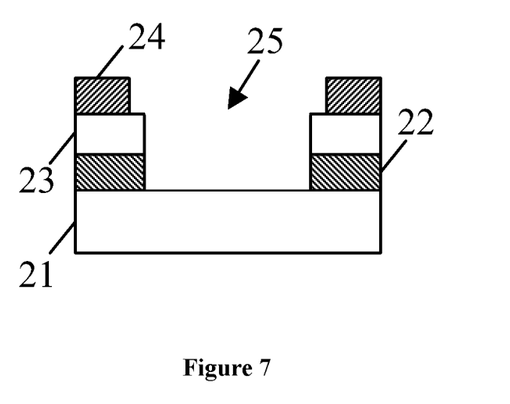

In step S204, as shown in FIG. 7, a pattern of the source and drain metal layer may be formed and the portion of each ESD line exposed by the openings 25 may be removed.

In the fabrication process illustrated in FIG. 3, a portion of each of the ESD lines 20 may be removed when the pattern of the source and drain metal layer is being formed and the array fabrication process can be simplified. In certain other embodiments of the present disclosure, a portion of each of the ESD lines 20 may also be removed in another step of the array fabrication process. The timing or step to remove the ESD lines 20 should not be limited by the embodiments of the present disclosure. In certain other embodiments, more than one portions of an ESD line 20 may be exposed by the openings and removed.

In the structure of the array substrate shown in FIG. 2b, the gate lines 11 may be in display region A. The common electrode lines 12 may be in peripheral region B. The common electrode lines 12 may extend in a direction perpendicular to a direction the gate lines 11 extend. When an ESD line 20 is electrically connected between one gate line 11 and one common electrode line 12, the two ESD lines 20 are connected to two adjacent gate lines 11 may be located on the same side of the peripheral region B.

Figure 10:
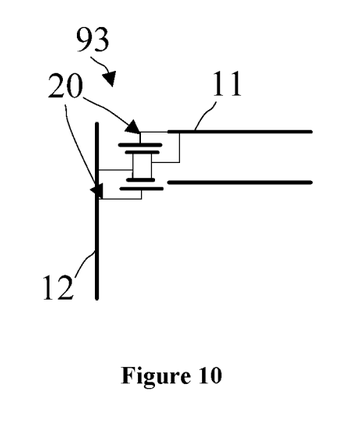

The present disclosure also provides another method for fabricating an array substrate. Different from the fabrication process illustrated by FIGS. 1 and 3, in addition to forming and removing a portion of each of the ESD lines, the method further includes combining the fabrication of the ESD lines and ESD diodes. Specifically, as shown in FIG. 10, two thin film transistors (TFTs) may be formed between a gate line 11 and a common electrode line 12. The source of each TFT may be connected to the gate of the same TFT. The source of one TFT may be connected to the drain of the other TFT. The gates of the two TFTs may be portions of the two ESD lines 20 connected to two adjacent signal lines, i.e., the gate line 11 and the common electrode line 12. The gate of one TFT may be a portion of one ESD line 20 connected to the gate line 11. The gate of another TFT may be a portion of another ESD line 20 connected to the common electrode line 12.

In one embodiment, the gates of the two TFTs may be portions of the two ESD lines 20 connected to two adjacent signal lines, i.e., the gate line 11 and the common electrode line 12. It should be noted that, the gates of the two TFTs may also be portions of the two ESD lines 20 not connected to two adjacent gate lines 11.

In one embodiment, the two TFTs formed on array substrate may enable the accumulated positive and/or negative charges on the gate lines 11 to be discharged to the common electrode lines 12. Further, because the two ESD lines 20 are used as the gates of the two TFTs, no additional step may be required to form the ESD diodes.

Figure 8A:
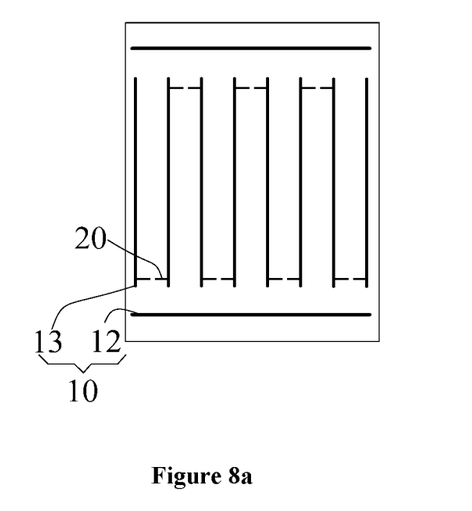
FIGS. 8 to 10 illustrate schematic views of other exemplary array substrates according to the disclosed embodiments.
Figure 8B:
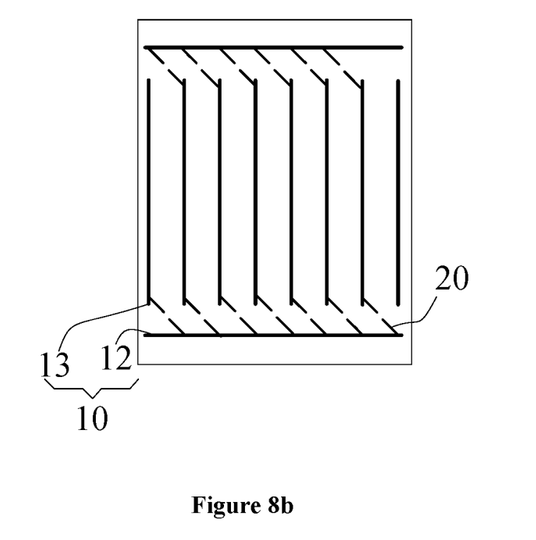

A second structure of the array substrate formed by the fabrication process illustrated in FIG. 1 may be shown in FIGS. 8a and 8b. In the second structure, the ESD lines are in the same layer as the data lines. That is, the first pattern may the pattern in the source and drain metal layer, and the second pattern may be the pattern in a pixel electrode layer.

FIGS. 8a and 8b each illustrates the schematic view of an array substrate. In the array substrates illustrated in FIGS. 8a and 8b, the signal lines 10 may include a plurality of data lines 13 and a plurality of common electrode lines 12. The two ends of each ESD line 20 may be electrically connected to two data lines 13, as shown in FIG. 8a. One end of each ESD line 20 may be electrically connected to one data line 13 and the other end of the ESD line 20 may be connected to one common electrode line 12, as shown in FIG. 8b.

It should be noted that, in the structure shown in FIG. 8a, the common electrode lines 12 may be in the same layer as the data lines 13. Alternatively, the common electrode lines 12 may not be in the same layer as the data lines 13. Also, as described above, one end of each ESD line 20 may be electrically connected to one data line 13 and the other end of the ESD line may be connected to one common electrode connection line. Other combination of two signal lines may also be connected by the two ends of an ESD line 20. Further, the ESD lines 20 may have other suitable shapes in addition to the straight lines as shown in FIGS. 8a and 8b. For example, the ESD lines 20 may be curved lines, broken lines, or lines of other suitable shapes.

In one embodiment, as shown in FIGS. 8a and 8b, the plurality of ESD lines 20 may be used to connect any two adjacent data lines 13. In certain other embodiments, the plurality of ESD lines 20 may be used to connect two data lines 13 separated by other data lines 13.

When the plurality of ESD lines 20 are used to connect two data lines 13 separated by other data lines 13, the ESD lines 20 may be in the same layer as the data lines 13. Preferably, a portion of each of the ESD lines 20 may be removed in the subsequent process after the SD process. For example, in the multi-dimensional electric field mode, a passivation layer and pixel electrodes may need to be formed after the SD process. Thus, openings may be formed in the passivation layer and a portion of each of the ESD lines may be removed when the pixel electrodes are being formed. The timing or step to remove a portion of each ESD line are only for illustrative purposes and should not be limited to the embodiments of the present disclosure.

Embodiments of the present disclosure also provide another method for fabricating an array substrate. Different from the fabrication processes described above, the ESD lines formed using the method may have a different structure. Each of the ESD line structure may include two connecting portions and a discharging portion formed between the two connecting portions. The width of the discharging portion may be less than the width of a connecting portion. The width of the discharging portion may be less than about 1.5 μm. It should be noted that the structure of the ESD line described is for only illustrative purposes and should not be limited by the embodiments of the present disclosure. The ESD line structure may also be a straight line with a uniform width less than about 1.5 μm.

When a portion or the entire ESD line has a width less than about 1.5 μm, under a certain amount of accumulated electrostatic charges, the ESD line may be melted to discharge electrostatic charges before a portion of the ESD line being removed. When an ESD line has sufficiently wide connecting portions and sufficiently narrow discharging portion, the ESD line may be designed to be melted at the discharging portion. If an ESD line is not melted, a portion of the ESD line can be removed, and the discharging points may be formed at the removed position. Specifically, after the ESD line is cut off, the two broken ends at the cut off positions may become tips compared to other portions of the ESD lines. When electrostatic charges are generated during the process to fabricate the display panel, the electrostatic charges may accumulate at the two tips and form point discharging.

In some embodiments, the width of the discharging portion may be about 1 μm.

Further, to ensure point discharging, a gap of about 1 to 8 μm between the two broken ends of an ESD line may be formed. Preferably, the gap may be about 3 to 5 μm.

The present disclosure also provides another method for fabricating an array substrate. Different from the methods previously described, in the method, when a portion of an ESD line is being removed, the two broken ends at the removed position may each form a terminal. Either terminal may include at least one sharp terminal pointing at the other terminal.

Specifically, the two terminals may each have a triangular shape. The two triangular shapes may be the same or different. The tips of the two triangular shapes may be pointing at each other.

When a portion of an ESD line is removed in the middle, two ends pointing at each other may be formed. Either one of the ends may include at least one tip pointing at the other tip such that electrostatic charges generated during the fabrication process of the display panel may accumulate at the two ends (i.e., the two broken ends) to enable tip discharging.

It should be noted that, the two terminals may also have other suitable shapes, e.g., shapes capable or incapable of forming point discharging, and should not be limited by the embodiments of the present disclosure.

In methods for fabricating the array substrates described above, the two ESD lines connected to the same gate line or data line may be connected at the two ends of the gate line or data line, as shown in FIGS. 2a, 2b, 8a and 8b. Thus, the electric current may flow through the entire gate line or data line. The current may undergo undesirably high loss and the accumulation of the electrostatic charges may be slow.

The arrangement or configuration of ESD lines are only for illustrative purposes. Other configurations of ESD lines may also be used without departing from the scope of the present disclosure. For example, only one ESD line may be connected to each gate line or data line, and all the ESD lines may be configured to be on the same side of the gate lines or data lines. In another example, two ESD lines may be connected to each gate line or data line. The two ESD lines on some gate lines or data lines may be configured to be on the same side of the gate line or data line. The two ESD lines on some other gate lines or data lines may be configured to be on both sides of the gate lines or data lines.

Figure 9:
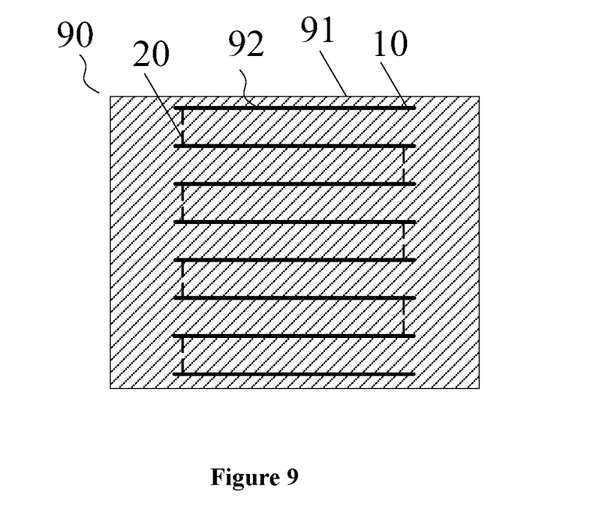

FIG. 9 illustrates the schematic view of an exemplary array. As shown in FIG. 9, the array substrate 90 may include a substrate 91 and a first pattern 92 on the substrate 91. The first pattern 92 may include a plurality of signal lines 10 and a plurality of ESD lines 20. An ESD line may be used to connect two signal lines 10. A portion of each ESD line may be removed when a second pattern is being formed on the first pattern 92.

In one embodiment, the electrostatic charges generated in the fabrication process of the array substrate may be discharged through the ESD lines 20. Specifically, an ESD line 20 may connect two signal lines 10. When ESD current is generated during the fabrication process of the array substrate, the electrostatic charges may spread in more than one signal lines. The ESD current may also spread in the signal lines and common electrode lines connected by the corresponding ESD line and form equal potentials. Damages to the array substrate caused by the high voltage formed by the ESD may be avoided. Thus, the array substrate can be protected from ESD and production yield of the array substrate can be improved. In the fabrication process of forming the second pattern on the first pattern, a portion of each of the ESD lines may be removed to ensure the array substrate can be operated normally after being fabricated.

It should be noted that the fabrication process described above should not be limited to pattern the layer formed directly on the layer with the first pattern. The fabrication process may also be used to pattern a layer formed indirectly on the layer with the first pattern, i.e., a layer formed on the layer with the first pattern with one or more layers in between.

The signal lines may include one or more of gate lines, gate connection lines, common electrode lines, common electrode connection lines, data lines, and data connection lines. Both ends of each ESD line may be electrically connected to two signal lines in the plurality of signal lines.

In one embodiment, the signal lines corresponding to the first pattern may be formed in the same layer. For example, the signal lines corresponding to the first pattern may be in the gate metal layer. The signal lines corresponding to the first pattern may also be in the source and drain metal layer. In this case, both ends of each ESD line may be electrically connected to the signal lines in the same layer. In another embodiment, the signal lines corresponding to the first pattern may be in different layers. For example, the signal lines corresponding to the first pattern may include the gate lines in the gate metal layer and the data lines in the source and drain metal layer.

In another embodiment, the signal lines corresponding to the first pattern may include the common electrode lines in the gate metal layer and the data lines in the source and drain metal layer. In this case, the ESD lines may include ESD lines formed in at least two different layers. The two ends of an ESD line may be electrically connected to two signal lines in two different layers. The portions of an ESD line in different layers may be electrically connected through via holes.

When the two ends of an ESD line are connected to the signal lines in the same layer, the ESD line and the corresponding signal lines may be formed in one patterning process. No additional patterning process may be required to form the ESD lines. For illustrative purposes, in an embodiment, the two ends of an ESD lines are connected to the signal lines in the same layer.

Specifically, the ESD lines may be in the same layer as the gate lines and the first pattern may be the pattern of the gate metal layer. Alternatively, the ESD lines may be in the same layer as the data lines and the first pattern may be the pattern of the source and drain metal layer.

It should be noted that, the pattern of the gate metal layer may often include the patterns of gates and gate lines. When the common electrode lines are designed to be in the same layer as the gate lines, the pattern of the gate metal layer may include patterns of the common electrode lines, gates, and gate lines. When gate connection lines and common electrode connection lines are also in the same layer as the gate lines, the pattern of the gate metal layer may further include patterns of the gate connection lines and the common electrode connection lines. The gate connection lines may be used for connecting the gate lines to a gate driving circuit. The common electrode connection lines may be used for inputting or sending electrical signals. The pattern of the source and drain metal layer may often include patterns of data lines, sources, and drains. When the common electrode lines are in the same layer as the data lines, the pattern of the source and drain metal layer may further include pattern of the common electrode lines.

When the ESD lines are in the same layer as the gate lines, the two ends of an ESD line may be electrically connected to two signal lines. The two signal lines may be one or two types of gate lines, gate connection lines, common electrode lines, and common electrode connection lines.

The array substrate illustrated in FIG. 9 may include two structures. The first structure may correspond to the embodiments shown in FIG. 2a or 2b. The second structure may correspond to the embodiments shown in FIG. 8a or 8b. Details are related to these Figures are not repeated herein.

Referring to FIG. 2b, the gate lines 11 may be in display region A. The common electrode lines 12 may be in peripheral region B. The common electrode lines 12 may extend in a direction perpendicular to a direction the gate lines 11 extend. When an ESD line 20 is electrically connected between one gate line 11 and one common electrode line 12, the two ESD lines 20 are connected to two adjacent gate lines 11 may be located on the same side of the peripheral region B.

FIG. 10 provides the circuit diagram of another array substrate. Different from the array substrate illustrated in FIG. 2b, the array substrate illustrated in FIG. 10 further includes ESD diodes combined with ESD lines. As shown in FIG. 10, the array substrate may further include two TFTs 93 formed between a gate line 11 and a common electrode line 12. The source of each TFT 93 may be connected to the gate of the same TFT. The source of one TFT 93 may be connected to the drain of the other TFT 93. The gates of the two TFTs 93 may be portions of the two ESD lines 20 connected to two adjacent signal lines, i.e., the gate line 11 and the common electrode line 12. The gate of one TFT 93 may be a portion of one ESD line 20 connected to the gate line 11. The gate of another TFT 93 may be a portion of another ESD line 20 connected to the common electrode line 12.

In one embodiment, the gates of the two TFTs 93 may be portions of the two ESD lines 20 connected to two adjacent signal lines, i.e., the gate line 11 and the common electrode line 12. It should be noted that, the gates of the two TFTs 93 may also be portions of the two ESD lines 20 not connected to two adjacent gate lines 11.

In one embodiment, the two TFTs 93 formed on array substrate may enable the accumulated positive and/or negative charges on the gate lines 11 to be discharged to the common electrode lines 12. Further, because the two ESD lines 20 are used as the gates of the two TFTs 93, no additional step may be required to form the ESD diodes.

Figure 11:
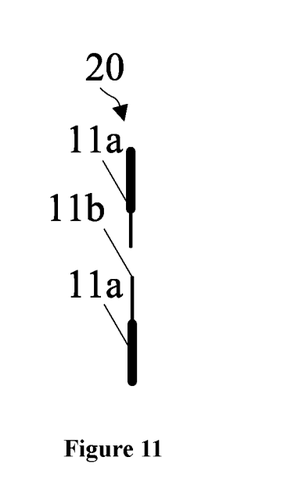
FIG. 11 illustrates a schematic view of an exemplary ESD line according to the disclosed embodiments.

Embodiments of the present disclosure also provide another array substrate. Different from the array substrates described above, the array substrate defines the structure of the ESD lines. FIG. 11 provides the structure of the ESD lines. As shown in FIG. 11, each of the ESD line structure may include two connecting portions 11a and a discharging portion 11b formed between the two connecting portions 11a. The width of the discharging portion 11b may be less than the width of a connecting portion 11a. The width of the discharging portion 11b may be less than about 1.5 μm. It should be noted that the structure of the ESD line described is for only illustrative purposes and should not be limited by the embodiments of the present disclosure. The ESD line structure may also be a straight line with a uniform width less than about 1.5 μm.

In some embodiments, an ESD line with two connecting portions 11a and a discharging portion 11b may be referred as a fuse unit.

The middle portion, i.e., the discharging portion 11b, of the ESD line may break. The width of the discharging portion 11b may be less than the width of the connecting portion 11a. Thus, the two broken ends at the removed position may become tips compared to other portions of the ESD line. It can be ensured that when electrostatic charges are generated during the process to fabricate the display panel, the electrostatic charges may accumulate at the two broken ends and form point discharging.

In some embodiments, the width of the discharging portion may be about 1 μm.

Further, to ensure point discharging, a gap of about 1 to 8 μm between the two broken ends of an ESD line may be formed. Preferably, the gap may be about 3 to 5 μm.

Figure 12:
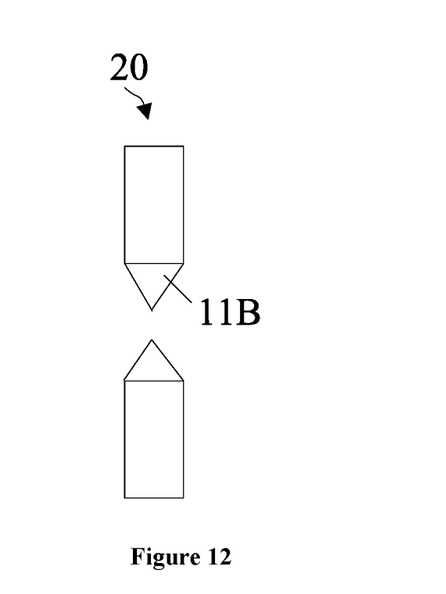
FIG. 12 illustrates a schematic view of another exemplary ESD line according to the disclosed embodiments.

The present disclosure also provides another array substrate. Different from the array substrates previously described, the array method defines the shapes of the broken ends of an ESD line. As shown in FIG. 12, when a portion of an ESD line is being removed or melted, the two broken ends at the cut off position may each form a terminal 11B. Either terminal 11B may include at least one sharp terminal pointing at the other terminal.

Specifically, the two terminals 11B may each have a triangular shape. The two triangular shapes may be the same or different.

When a portion of an ESD line is removed in the middle, two ends pointing at each other may be formed. Either one of the ends may include at least one tip pointing at the other tip such that electrostatic charges generated during the fabrication process of the display panel may accumulate at the two ends (i.e., the two broken ends) to enable tip discharging.

It should be noted that, the two terminals may also have other suitable shapes, e.g., shapes capable or incapable of forming point discharging, and should not be limited by the embodiments of the present disclosure.

In the array substrates described above, the two ESD lines connected to the same gate line or data line may be connected at the two ends of the gate line or data line. Thus, the electric current may flow through the entire gate line or data line. The current may undergo undesirably high loss and the accumulation of the electrostatic charges may be slow.

The present disclosure further provides a display device. The display device may include any one of the disclosed array substrates. The ESD lines in the array substrate may connect two signal lines. When ESD current is generated during the fabrication process of the array substrate, the ESD current may not spread in only one gate line. The ESD current may also spread in the gate lines or common electrode lines connected by the ESD lines to form equal potentials. Damages to the array substrate, caused by high voltage formed by ESD, may be avoided. Thus, the array substrate can be protected from ESD and production yield of the array substrate can be improved. In the fabrication process of forming the second pattern on the first pattern, a portion of each of the ESD lines may be removed to ensure the array substrate can be operated normally after being fabricated.

It should be noted that the display device may also include structures such as an external frame or related packaging structures.

The display device may be any device or product with display functions such as, an LCD panel, an electronic paper, an OLED panel, a smart phone, a tablet computer, a television, a monitor, a laptop computer, a digital picture frame, and a navigation device, etc.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for fabricating an array substrate, comprising:
   providing a substrate including a display region and a peripheral region;
   forming a first pattern on the substrate including a plurality of signal lines and a plurality of electrostatic discharge (ESD) lines, wherein an ESD line is configured to connect two signal lines and at least one end of the ESD line is located in the display region; and
   removing a portion of each ESD line during a process for forming a second pattern over the first pattern to disconnect the two signal lines.

2. The method according to claim 1, wherein:
   a signal line is at least one of a gate line, a gate connection line, a common electrode line, a common electrode connection line, a data line, and a data connection line; and
   one end of an ESD line is connected to a first signal line and the other end of the ESD line is connected to a second signal line.

3. The method according to claim 2, wherein:
   the first signal line and the second signal line are in a same layer and connected by at least one ESD line in the same layer; or
   the first signal line and the second signal line are in two different layers and connected by at least one ESD line with portions in the two different layers, wherein the portions in the two different layers are connected through via holes.

4. The method according to claim 2, wherein:
the ESD lines are in a same layer as the gate lines; and
each of two ends of an ESD line is connected to at least one of a gate line, a gate connection line, a common electrode line, and a common electrode connection line.

5. The method according to claim 2, wherein one end of the ESD line is connected to a signal line, and the other end of the ESD line is connected to an adjacent signal line.

6. The method according to claim 1, wherein:
the first pattern is a pattern of a gate metal layer; and
the second pattern is a pattern of a source and drain metal layer.

7. The method according to claim 6, wherein a process for removing a portion of each ESD line includes:
forming a gate insulating layer on the first pattern on the substrate;
forming openings in the gate insulating layer to expose at least a portion of each ESD line;
forming the pattern of the source and drain metal layer; and
removing the portion of each ESD line exposed by the openings.

8. The method according to claim 1, wherein a gap between two ends at a removed position of an ESD line is about 1 µm to 8 µm.

9. An array substrate, fabricated by the method according to claim 1.

10. The array substrate according to claim 9, wherein:
a signal line is at least one of a gate line, a gate connection line, a common electrode line, a common electrode connection line, a data line, and a data connection line; and
one end of an ESD line is connected to a first signal line and the other end of the ESD line is connected to a second signal line.

11. The array substrate according to claim 10, wherein:
the first signal line and the second signal line are in a same layer and connected by the ESD line in the same layer; or
the first signal line and the second signal line are in two different layers and connected by the ESD line with portions in the two different layers, wherein the portions in the two different layers are connected through via holes.

12. The array substrate of claim 10, wherein:
the first pattern is a pattern of a gate metal layer; and
the second pattern is a pattern of a source and drain metal layer.

13. The array substrate of claim 10, wherein:
gate lines are in a display region;
common electrode lines are in a peripheral region;
the common electrode lines extend in a direction perpendicular to a direction the gate lines extend; and
when the ESD lines are used to connect the gate lines and the common electrode lines, the two ESD lines connected to two adjacent signal lines are distributed at a same side of the peripheral region.

14. The array substrate according to claim 13, further including a first thin film transistor (TFT) and a second TFT formed between a gate line and a common electrode line, wherein:
a source and a gate of each TFT are connected together; and
the source of the first TFT is connected to the drain of the second TFT.

15. The array substrate according to claim 14, wherein gates of the first TFT and the second TFT are portions of ESD lines connected to two adjacent signal lines, wherein the gate of the first TFT is a portion of an ESD line connected to the gate line and the gate of the second TFT is a portion of another ESD line connected to the common electrode line.

16. A display device, comprising the array substrate of claim 9.

17. A method for fabricating an array substrate, comprising:
providing a substrate;
forming a first pattern on the substrate including a plurality of signal lines and a plurality of electrostatic discharge (ESD) lines, wherein an ESD line is configured to connect two signal lines; a signal line is at least one of a gate line, a gate connection line, a common electrode line, a common electrode connection line, a data line, and a data connection line; and one end of an ESD line is connected to a first signal line and the other end of the ESD line is connected to a second signal line; and
removing a portion of each ESD line during a process for forming a second pattern over the first pattern to disconnect the two signal lines, wherein:
the ESD lines are in a same layer as the gate lines;
each of two ends of an ESD line is connected to at least one of a gate line, a gate connection line, a common electrode line, and a common electrode connection line;
the gate lines are in a display region;
the common electrode lines are in a peripheral region;
the common electrode lines extend in a direction perpendicular to a direction the gate lines extend; and
when the ESD lines are used to connect the gate lines and the common electrode lines, the two ESD lines connected to two adjacent signal lines are distributed at a same side of the peripheral region.

18. The method according to claim 17, further including forming a first thin film transistors (TFT) and a second TFT formed between a gate line and a common electrode line, wherein:
a source and a gate of each TFT are connected together;
the source of the first TFT is connected to the drain of the second TFT; and
gates of the first TFT and the second TFT are portions of ESD lines connected to two adjacent signal lines.

19. The method according to claim 18, wherein the gate of the first TFT is a portion of an ESD line connected to the gate line and the gate of the second TFT is a portion of another ESD line connected to the common electrode.

20. A method for fabricating an array substrate, comprising:
providing a substrate;
forming a first pattern on the substrate including a plurality of signal lines and a plurality of electrostatic discharge (ESD) lines, wherein an ESD line is configured to connect two signal lines; and
removing a portion of each ESD line during a process for forming a second pattern over the first pattern to disconnect the two signal lines, wherein:
each ESD line includes two connecting portions and a discharging portion configured between the two connecting portions;
for each ESD line, a width of the discharging portion is less than a width of a connecting portion; and
the width of the discharging portion is less than 1.5 µm.

* * * * *